(12) United States Patent
Kim et al.

(10) Patent No.: US 8,173,978 B2
(45) Date of Patent: May 8, 2012

(54) METHOD FOR CONTROLLING ELECTRON BEAM IN MULTI-MICROCOLUMN AND MULTI-MICROCOLUMN USING THE SAME

(75) Inventors: Ho Seob Kim, Chonan-shi (KR); Byeng Jin Kim, Incheon (KR)

(73) Assignee: Cebt Co., Ltd (KR)

( * ) Notice: Subject to any disclaimer, the term of this patent is extended or adjusted under 35 U.S.C. 154(b) by 800 days.

(21) Appl. No.: 11/571,695

(22) PCT Filed: Jul. 5, 2005

(86) PCT No.: PCT/KR2005/002145
§ 371 (c)(1),
(2), (4) Date: Jan. 28, 2008

(87) PCT Pub. No.: WO2006/004374
PCT Pub. Date: Jan. 12, 2006

(65) Prior Publication Data
US 2010/0019166 A1    Jan. 28, 2010

(30) Foreign Application Priority Data

Jul. 5, 2004   (KR) ........................ 10-2004-0052102
Aug. 11, 2004  (KR) ........................ 10-2004-0063303
Jun. 3, 2005   (KR) ........................ 10-2005-0047526

(51) Int. Cl.
*H01J 37/08* (2006.01)
(52) U.S. Cl. .................. 250/492.22; 250/306; 250/307; 250/310; 250/311; 250/492.2
(58) Field of Classification Search .................. 250/306, 250/307, 310, 311, 492.1, 492.2, 492.22
See application file for complete search history.

(56) References Cited

U.S. PATENT DOCUMENTS

| 5,998,795 A | 12/1999 | Chisholm |
| 6,023,060 A | 2/2000 | Chang et al. |
| 6,369,385 B1 * | 4/2002 | Muray et al. ............... 850/9 |
| 6,570,163 B1 | 5/2003 | El Gomati et al. |

(Continued)

FOREIGN PATENT DOCUMENTS

EP    0 316 871 A    5/1989

(Continued)

OTHER PUBLICATIONS

E. Kratschmer, et al., An electron-beam microcolumn with improved resolution, beam current, and stability, J. Vac. Sci. Technol. B, Nov./Dec. 1995, 6, 13-6, Amer. Vacuum Society, U.S.A.

(Continued)

*Primary Examiner* — Michael Maskell
(74) *Attorney, Agent, or Firm* — John K. Park; Park Law Firm

(57) ABSTRACT

Provided is a method for controlling electron beams in a multi-microcolumn, in which unit microcolumns having an electron emitter, a lens, and a deflector are arranged in an n×m matrix. A voltage is uniformly or differentially applied to each electron emitter or extractor. The same control voltage or different voltages are applied to a region at coordinates in a control division area of each extractor to deflect the electron beams. Lens layers not corresponding to the extractors are collectively or individually controlled so as to efficiently control the electron beams of the unit microcolumn. Further, a multi-microcolumn using the method is provided.

20 Claims, 5 Drawing Sheets

U.S. PATENT DOCUMENTS

| | | | |
|---|---|---|---|
| 6,617,587 B2 * | 9/2003 | Parker et al. | 250/398 |
| 6,943,351 B2 * | 9/2005 | Parker et al. | 850/6 |
| 7,638,777 B2 * | 12/2009 | Feuerbaum et al. | 250/396 R |
| 2003/0122087 A1 * | 7/2003 | Muraki et al. | 250/492.2 |

FOREIGN PATENT DOCUMENTS

| | | |
|---|---|---|
| JP | 1993-251315 | 9/1993 |
| JP | 1999-016967 | 1/1999 |
| JP | 2000-514238 | 10/2000 |
| JP | 2001-244186 | 9/2001 |
| JP | 2003-217499 | 7/2003 |
| KR | 20030066003 | 9/2003 |
| WO | WO 99/14785 A | 3/1999 |
| WO | WO 99/45565 A | 9/1999 |
| WO | WO 00/67290 A | 11/2000 |

OTHER PUBLICATIONS

E. Kratschmer, et al., Experimental evaluation of a 20×20 mm footprint microcolumn, J. Vac. Sci. Technol. B, Nov./Dec. 1996, 5, 14-6, American Vacuum Society, U.S.A.

T.H.P. Chang, et al., Electron-beam microcolumns for lithography and related applications, J. Vac. Sci. Technol. B, Nov./Dec. 1996, 8, 14-6, American Vacuum Society, U.S.A.

Ho Seob Kim, et al., Multi-beam mlcrocolurnns based on arrayed SCM and WCM, Journal of the Korean Physical Society, Nov. 2004, 4, 45-5, The Korean Physical Society. Rep. of Korea.

Ho Seob Kim, et al., Arrayed microcolumn operation with a waferscale Einzel lens, Microelectronic Engineering, 2005, 7, 78-79, Elsevier B.V., U.S.A.

* cited by examiner

[Fig. 1]
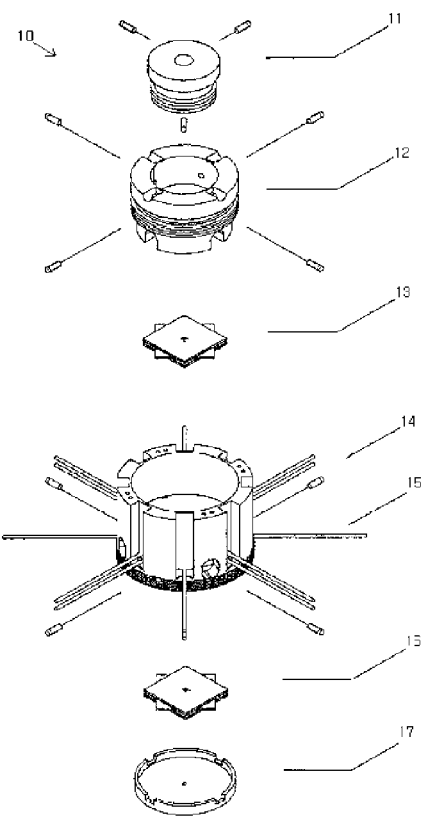
[Fig. 2]
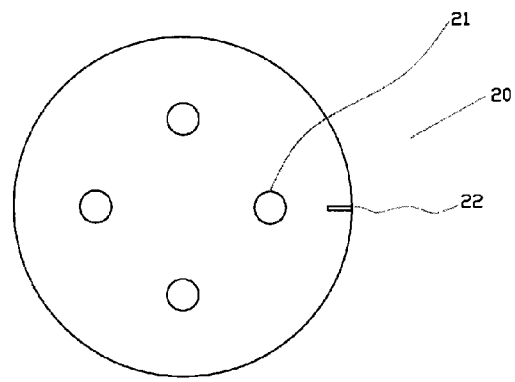
[Fig. 3]
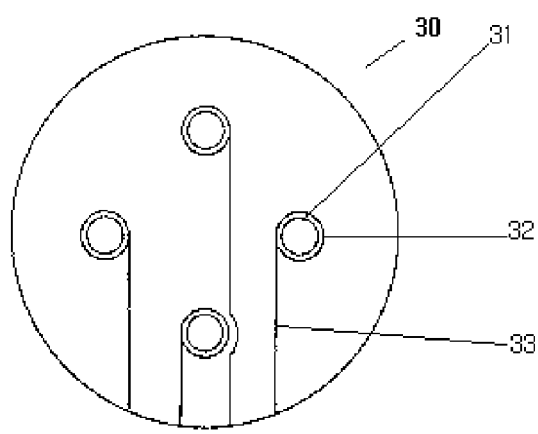

[Fig. 4]
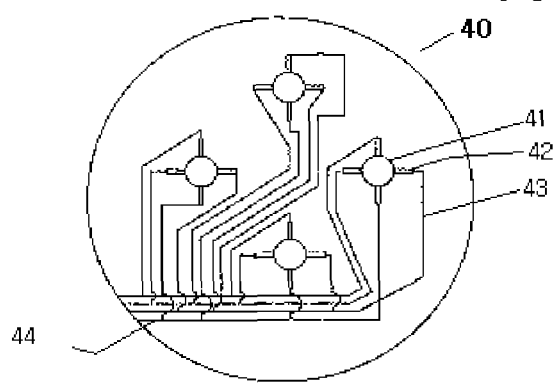
[Fig. 5]
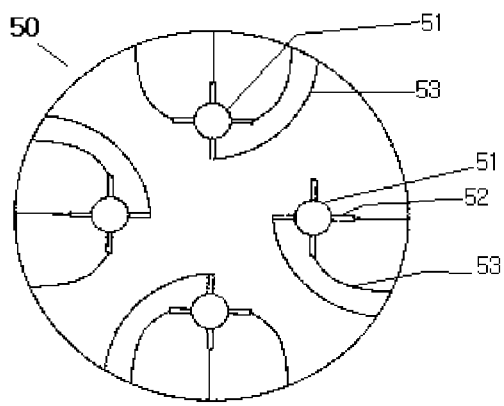
[Fig. 6]
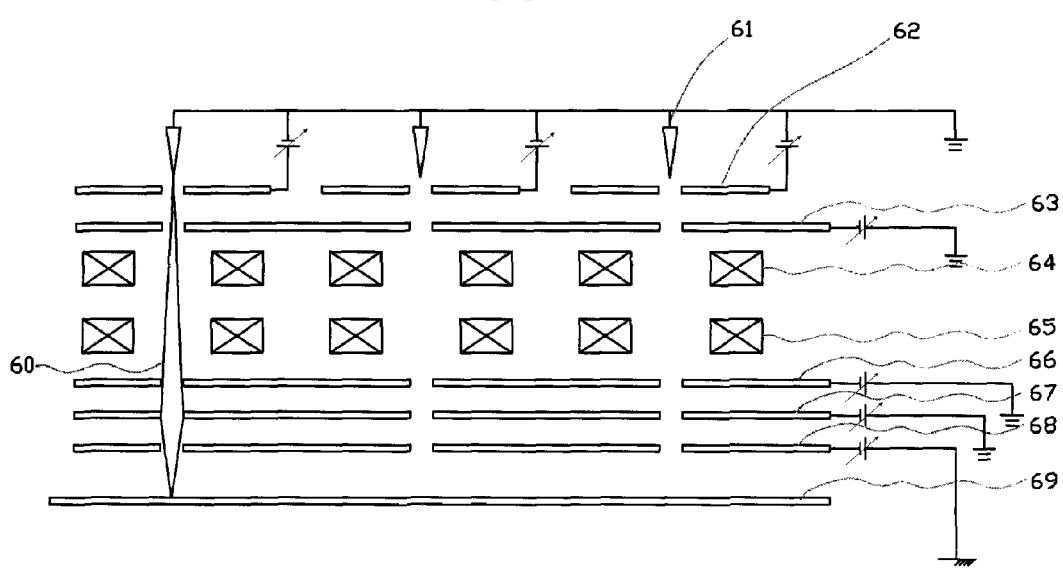

[Fig. 7]
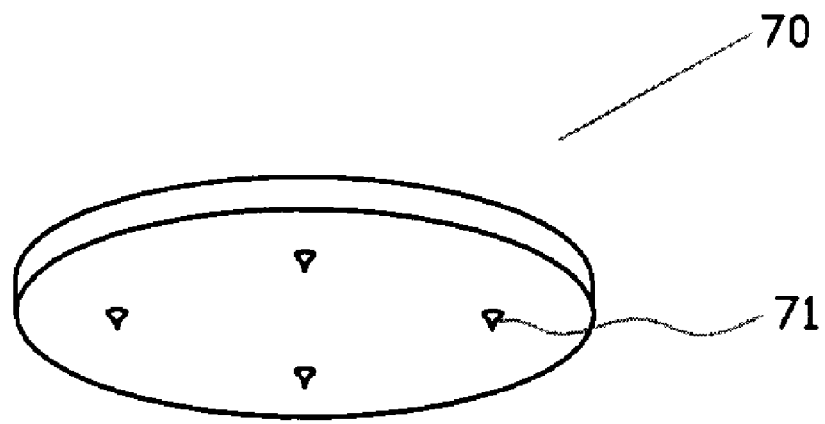
[Fig. 8]
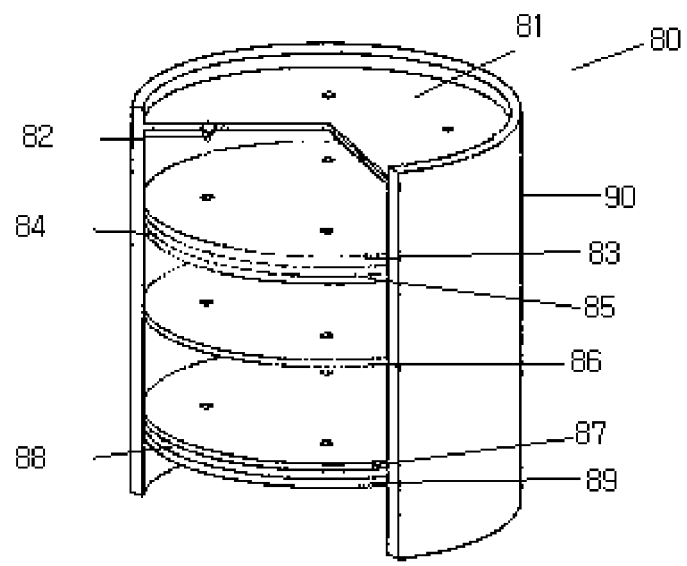
[Fig. 9]
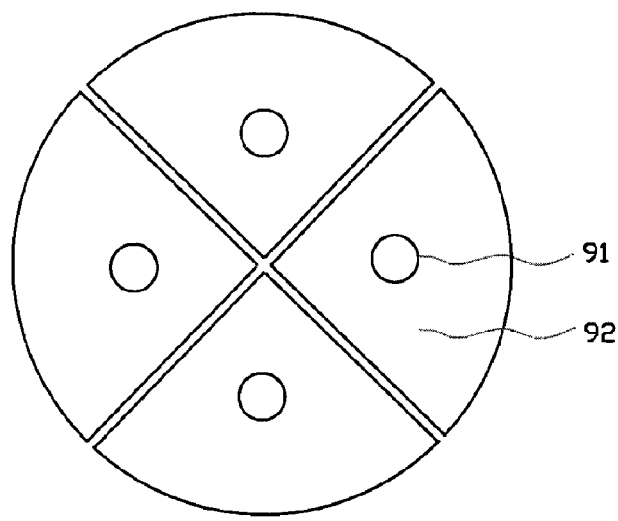

[Fig. 10]
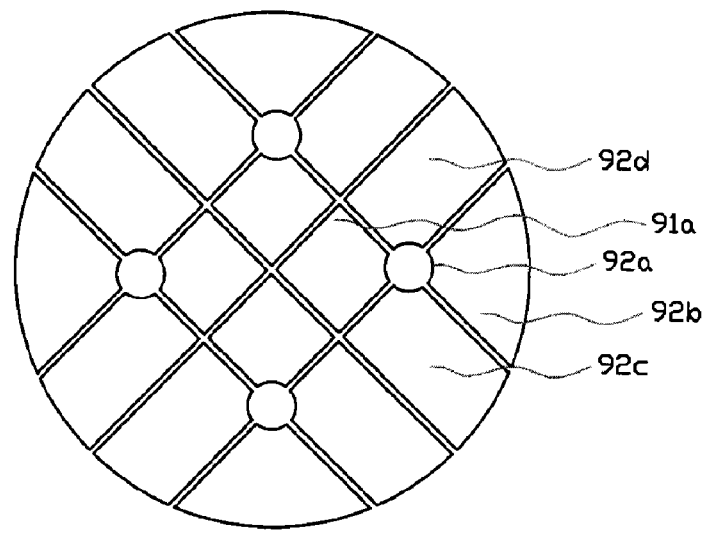
[Fig. 11]
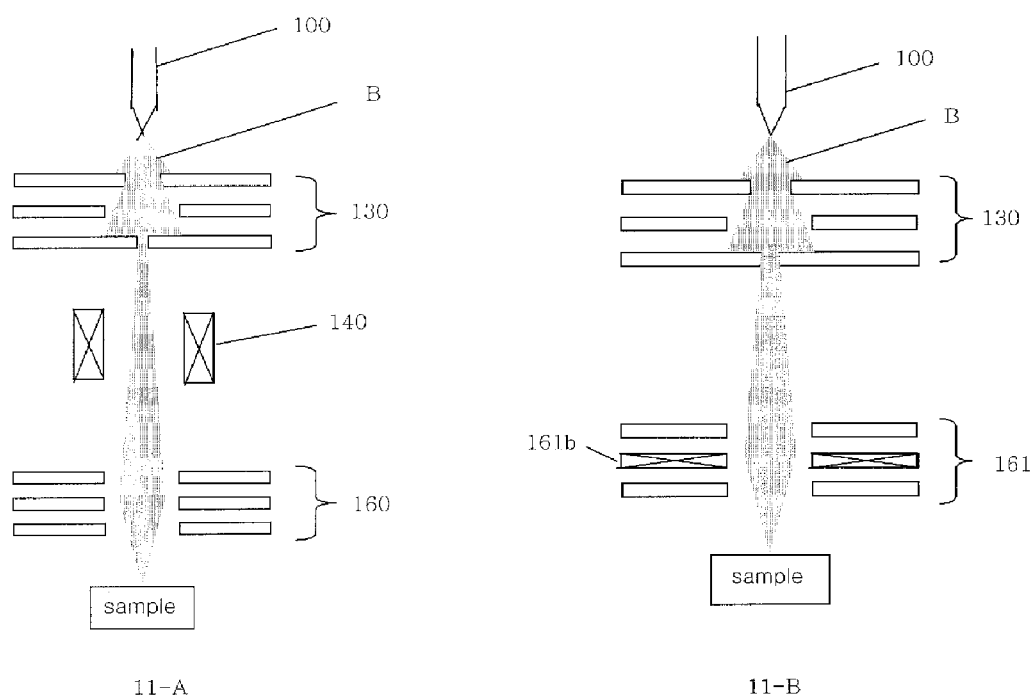
11-A          11-B

[Fig. 12]
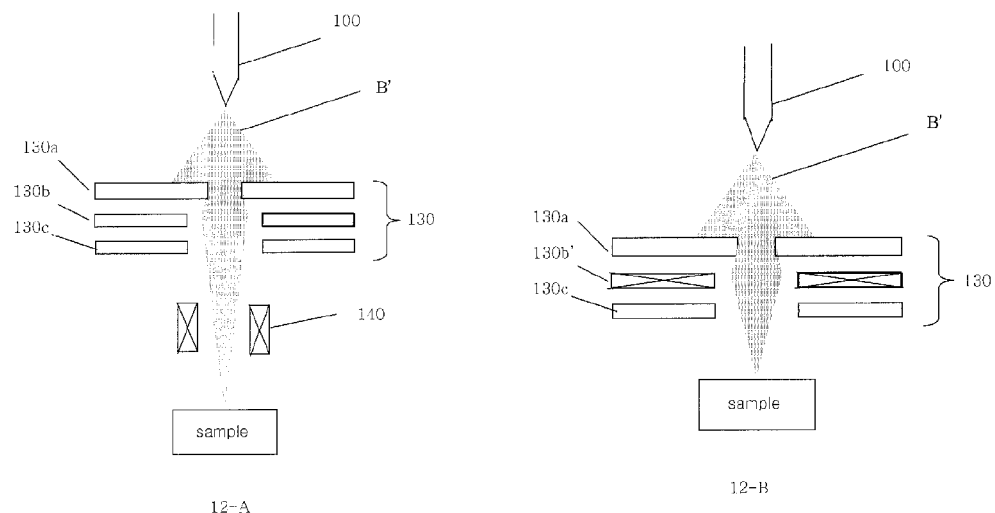
[Fig. 13]
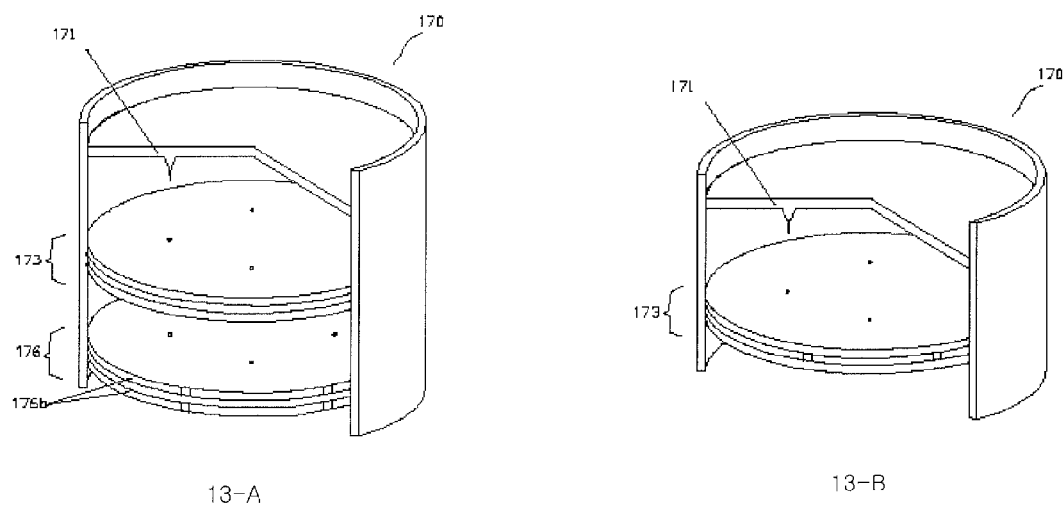

METHOD FOR CONTROLLING ELECTRON BEAM IN MULTI-MICROCOLUMN AND MULTI-MICROCOLUMN USING THE SAME

TECHNICAL FIELD

The present invention relates to a method for controlling electron beams of a multi-microcolumn, and more particularly, a method for controlling electron beams emitted from electron emitters of a multi-microcolumn. Further, the present invention relates to a multi-microcolumn capable of using the control method.

BACKGROUND ART

A conventional microcolumn can be thought of as a microscopic electron column with high efficiency by miniaturizing an electron column using the principle of controlling an electron beam in an apparatus such as a Cathode Ray Tube (CRT), a scanning electron microscope, electron beam lithography equipment, etc. While only a single microcolumn has been developed conventionally, the need for a multi-microcolumn and the possibility of fabricating a single microcolumn combination type multi-microcolumn and a wafer type multi-microcolumn are apparent.

In a microcolumn, generally, an electron beam is generated by an electron emitter, transmitted through various lenses, and deflected by a deflector. In an existing single microcolumn, the electron beam is controlled by applying a separate voltage in each lens system or deflector. An example of the structure of a single microcolumn is disclosed in Korean Patent Application No. 2003-66003 and shown in FIG. 1. Referring to FIG. 1, a single microcolumn 10 is essentially composed of an electron emitter (not shown), a source lens 13, a deflector 15 and a focus lens 16. Further, the single microcolumn 10 includes an electron emitter holder 11 for supporting the electron emitter, a holder base 12 for receiving the source lens 13, a column base 14 for receiving the deflector 15, and a lens plate 17 for receiving the focus lens 16.

Control of a single electron beam in the single microcolumn has been studied extensively. However, in the case of a multi-microcolumn, problems of how to integrate a plurality of single microcolumns and how to control the electron beams remain to be solved. In other words, a problem of how to control a plurality of single microcolumns still remains to be solved.

DISCLOSURE OF INVENTION

Technical Problem

It is an objective of the present invention to provide a method for controlling electron beams in a multi-microcolumn, capable of emitting electrons from each electron emitter of each of a plurality of unit microcolumns to form the electron beam and efficiently controlling the electron beams in order to easily and efficiently control the multi-microcolumn.

It is another objective of the present invention to provide a wafer type multi-microcolumn to which the above-mentioned method can be applied.

It is yet another objective of the present invention to provide a hybrid multi-microcolumn combining a wafer type multi-microcolumn and a conventional microcolumn, to which the above-mentioned method can be applied.

Technical Solution

An exemplary embodiment of the present invention provides a method for controlling electron beams in a multi-microcolumn, in which unit microcolumns for emitting electrons to form and control the electron beams are arranged in an n×m matrix. The method comprises: a step of selectively controlling individual electron emitters and electron lenses using a method selected from among: a first type of applying a single voltage to all apertures through which the electrons of the unit microcolumns pass or to all the electron emitters, a second type of applying a voltage to each unit microcolumn (aperture or electron emitter), a third type of applying the same voltage to each same-directional (-coordinate) electrode per unit microcolumn, and a fourth type of applying a voltage to each unit microcolumn and electrode (direction or coordinate); a step of applying a voltage to the individual electron emitters and the individual extractors of the lenses according to the first or second type in order to induce emission and electron current; and a step of applying a voltage according to the third or fourth type to deflect the electron beams.

Another exemplary embodiment of the present invention provides a multi-microcolumn having unit microcolumns which include an electron emitter and at least one lens and are arranged in an n×m matrix. The multi-microcolumn is characterized by: selectively constructing individual electron emitters and individual electron lenses according to a method selected from among: a first type of applying a single voltage to all apertures through which the electrons of the unit microcolumns pass or to all the electron emitters, a second type of applying a voltage to each unit microcolumn (aperture or electron emitter), a third type of applying the same voltage to each same-directional (-coordinate) electrode per unit microcolumn, and a fourth type of applying a voltage to each unit microcolumn and electrode (direction or coordinate); and applying a voltage to the individual electron emitters or individual extractors of the lens according to the first or second type in order to induce emission and electron current.

In the configuration of the multi-microcolumn, the electron emitters, source lenses, deflectors, and focus lenses are generally arranged in that order. The focus lenses may be disposed ahead of the deflectors. Furthermore, the focus lenses and the deflectors may be combined. In other words, arrangement of the lenses including the source lenses and/or the focus lenses and the deflectors may be varied as required.

In general, the multi-microcolumn is composed of constituents to form the electron beams by means of electrons generated by application of a voltage to the electron emitters, and to control intensity (current) and direction of the electron beams as required. Specifically, electrons are emitted from each of the electron emitters by a potential difference between the electron emitter and the extractor of the source lens. The emitted electrons form the electron beam by passing through the source lens, and the formed electron beam is deflected and/or focused. To this end, the quantity, direction, etc., of the electron beam are controlled. In this way, the multi-microcolumn is driven.

According to a method of forming and controlling an electron beam in the microcolumn, in general, the electrons are emitted from the electron emitter, only a necessary fraction of the emitted electrons forms the electron beam, and the formed electron beam is deflected as required and focused on a sample. To this end, the microcolumn is generally composed of an electron emitter for emitting the electrons, a source lens for forming the electrons emitted from the electron emitter into the electron beam, a deflector for deflecting the electron beam, and a focus lens for focusing the deflected electron beam on the target sample. Of course, a different type of microcolumn may be constructed with the above-described functions but would still involve the electron beam being formed and focused on the sample. Each lens or deflector constituting the microcolumn can be selected as required.

The method for controlling the electron beams in the multi-microcolumn in accordance with the present invention is directed to applying a voltage to the electron emitters and lenses in various ways in order to control the formation, current, and propagation of each of the electron beams. In other words, the voltage is applied to each portion needed to be controlled based on its characteristic in as simple a way as possible, thereby efficiently controlling the electron beams. The multi-microcolumn is formed by combination of unit microcolumns, each of which corresponds to an existing single microcolumn. Constituents of each unit microcolumn are equal or substantially similar to the existing single microcolumn. In other words, each constituent of the multi-microcolumn of the present invention, such as the electron emitter, electron lens and deflector, has a basic operational principle which is based on a conventional operational principle of the single microcolumn disclosed in existing papers and related patents. Papers on this principle include "An Electron Beam Microcolumn With Improved Resolution, Beam Current, and Stability" by E. Kratschmer et al. 6, J. Vac. Sci. Technol. B13(6), pp. 2498-2503, 1995, and "Experimental Evaluation of a 20×20 mm Footprint Microcolumn" J. Vac. Sci. Technol. B14(6), pp. 3792-3796, 1996. Related patents include U.S. Pat. Nos. 6,297,584, 6,281,508, and 6,195,214.

The multi-microcolumn may be composed of a single column module (SCM) where a plurality of single microcolumns are arranged in series or parallel, or two or more standardized monolithic column modules (MCMs), namely a multi-column adopting 2×1 or 2×2 as a set. Further, there is a multi-column structure composed of a wafer-scale column module (WCM) where a piece of wafer becomes a lens part of a column.

This basic concept is disclosed in "Electron Beam Microcolumns for Lithography and Related Applications" by T. H. P. Chang et al. 8, J. Vac. Sci. Technol. B14, pp. 3774-3781, 1996.

Another mode is a hybrid multi-mode in which one or more columns may be arranged together with SCM and MCM or WCM, and some lens parts of the column may employ SCM, MCM, or WCM. Basic experimental results of this are disclosed in papers "Multi-Beam Microcolumns Based On Arrayed SCM and WCM," by Ho-Seob KIM et al. 7, Journal of the Korean Physical Society, Vol. 45, No. 5, pp. 1214-1217, 2004, Microelectronic Engineering, by Ho-Seob KIM et al. 6, pp. 78-79, pp. 55-61, 2005, and "Arrayed Microcolumn Operation With a Wafer-Scale Einzel Lens."

The method for controlling the electron beams in the multi-microcolumn in accordance with the present invention is directed to collectively or individually controlling the constituents of each unit microcolumn such as the electron emitter, electron lens, and deflector, thereby efficiently controlling the electron beams of the entire multi-microcolumn.

The method for controlling the electron beams according to the present invention can be applied to various multi-microcolumns, for example, the case of using existing single microcolumns in a group, a wafer-type multi-microcolumn, as well as a hybrid multi-microcolumn combining a wafer-type multi-microcolumn and the existing single microcolumn.

Thus, the method for controlling the electron beams according to the present invention can be used in any multi-microcolumn, but for easy understanding of the present invention, a method of controlling the electron emitter, the source lens including the extractor, the deflector, and the focus lens, which are basic constituents of the wafer-type multi-microcolumn is described below with reference to the attached drawings. In FIGS. 2 to 5, a multi-microcolumn composed of four unit microcolumns is described. However, the number of unit microcolumns can be varied so long as there are two or more, and the principles of the control method can be equally applied.

First, a principle of controlling electron beams in a multi-microcolumn according to the present invention will be described in short.

The electron emitters are all subjected to application of the same voltage. As shown in FIG. 6, in the wafer-type microcolumn, each electron emitter is formed of one layer and subjected to application of the same voltage. In other words, a predetermined voltage is set up, and a kind of voltage is applied to all electron emitters. In the meantime, the existing microcolumn is wired and controlled so as to apply the same voltage to all the electron emitters. In this case, although the same voltage is applied, the intensity and direction of the electron beams emitted from the electron emitters may not be the same.

Therefore, the emitting electrons from each electron emitter is controlled by an extractor, and the quantity and direction of the desired electron beam are required to be controlled. Hence, each extractor is independently controlled by a separate voltage applied thereto. An applied voltage to each electron emitter and/or each extractor can be determined by checking the electron beam current finally emitted in each unit microcolumn (a final current passing through each lens and deflector). This can be performed by the control method of the existing single microcolumn. For example, when the electron beam current used in a predetermined unit microcolumn is less than a preset reference value, a negative voltage, generally, is additionally applied at the electron emitter to emit the electrons. Therefore, it does not matter that a positive voltage is additionally applied at the extractor. If one electron beam current is much higher the others, a lower positive (or higher negative) voltage is applied to the corresponding extractor. Specifically, the current of each electron beam is measured in the multi-microcolumn, the lowest positive (or highest negative) voltage is applied to the extractor of the unit microcolumn where the electron beam current is largest, and a relatively high positive (or low negative) voltage is applied to the other extractors.

This method has an advantage that energy of each electron beam of the unit microcolumn can be controlled to equally reach samples. The electron beams may be controlled in inverse relation to the method. To be specific, since emission of the electrons from each electron emitter is caused by a potential difference between the electron emitter and the extractor, the electron emitters are individually controlled and the extractors are collectively controlled. Further, when one or more electron control electrode layer is added together with the extractor, it is possible to enhance efficiency and resolution of each electron beam, probe beam current, etc., by accelerating and restricting electrons.

And, the electron beams controlled by the source lenses including the extractors are deflected by the deflectors, respectively. The deflecting is differently controlled depending on usage of the multi-microcolumn. Fundamentally, each unit deflector has a plurality of electrodes. The electron beams are deflected in a desired direction by applying a separate voltage to each electrode. Therefore, in the deflectors, if each of four deflectors has four electrodes, a total of 16 different voltages are adapted to be applied. However, when application of the different voltages to all the electrodes is difficult to control, when control of the electron beams of the multi-microcolumn is not precise, when scanning is equally performed on each preset coordinate, or when they are combined, the same voltage is applied at each unit coordinate, and thus the whole electron beams are controlled in the same direction. Thereby, the number of targets to be controlled can be reduced with ease. In this case, the voltage to be controlled is the same as number of the unit coordinates.

The other unit lenses irrelevant to deflecting can control the electron beams by causing the same voltage to be applied without a separate electrode.

Advantageous Effects

The method for controlling electron beams in the multi-microcolumn according to the present invention enables simple and easy control the electron beams of the multi-microcolumn. Also, the multi-microcolumn according to the present invention allows the control method to be efficiently performed.

BRIEF DESCRIPTION OF THE DRAWINGS

FIG. 1 is an exploded perspective view of a conventional single microcolumn.

FIG. 2 is a plan view showing an electron beam control layer of a first type of multi-microcolumn according to the present invention.

FIG. 3 is a plan view showing an electron beam control layer of a second type of multi-microcolumn according to the present invention.

FIG. 4 is a plan view showing an electron beam control layer of a third type of multi-microcolumn according to the present invention.

FIG. 5 is a plan view showing an electron beam control layer of a fourth type of multi-microcolumn according to the present invention.

FIG. 6 is a cross-sectional view showing control of electron beams in a multi-microcolumn according to the present invention.

FIG. 7 is a schematic perspective view showing a layer of a wafer type electron emitter of a multi-microcolumn according to the present invention.

FIG. 8 is a schematic perspective view of a part of a complex multi-microcolumn according to the present invention.

FIG. 9 is a plan view showing an example of another control layer of a second type according to the present invention.

FIG. 10 is a plan view showing an example of another control layer of a third and/or fourth type according to the present invention.

FIGS. 11A and 11B are conceptual diagrams showing an exemplary embodiment of operation of a microcolumn according to the present invention.

FIGS. 12A and 12B are conceptual diagrams showing another exemplary embodiment of operation of a microcolumn according to the present invention.

FIGS. 13A and 13B are exploded perspective views showing an exemplary embodiment of a microcolumn according to the present invention.

BEST MODE FOR CARRYING OUT THE INVENTION

Precise control of electron beams in a multi-microcolumn according to an exemplary embodiment of the present invention will be described in detail below.

FIGS. 2 to 5 show an exemplary embodiment enabling application of a method for controlling electron beams in a multi-microcolumn according to the present invention, in which each wafer-type electron lens or deflector is classified according to voltage application method.

In a first type, a single voltage is applied either to the apertures through which electrons pass or the electron emitters of each unit microcolumn. As shown in FIG. 2, the single voltage is applied to all layers. When the single voltage is applied to a connection 22 from the outside, the same voltage is applied to constituents of each unit microcolumn, for example, lens apertures.

In a second type, different voltages are applied to individual apertures or electron emitters of each unit microcolumn. As shown in FIG. 3, the different voltages are applied to constituents (apertures or electron emitters) of each unit microcolumn of a layer. The different voltages are applied to electrodes 32 from the outside.

In a third type, the same voltage is applied to individual same-directional (coordinate) electrodes for the apertures or electron emitters of each unit microcolumn. As shown in FIG. 4, the same voltage is applied to electrodes at coordinates corresponding to each constituent (aperture) of each unit microcolumn of a layer. Thus, the individual control voltages corresponding to the number of controlled coordinates are applied regardless of the number of unit microcolumns.

In a fourth type, different voltages are applied to individual apertures (or electron emitters) and individual electrodes (directions or coordinates) of each unit microcolumn. As shown in FIG. 5, an electrode is provided to each constituent (aperture) of each unit microcolumn of a layer at each coordinate, and a different voltage is applied to the electrode of each aperture, thereby separately controlling the electron beam in the respective unit microcolumn. Thus, the control voltages corresponding to the product of the number of unit microcolumns and the number of controlled coordinates can be applied individually.

A lens of the unit microcolumn has at least one layer with one hole. The hole has a certain shape to determine the shape of the emitted beam, and is generally circular. Alternatively, the hole may have a polygonal shape such as a triangle, a rectangle, etc. In addition, the hole may take on the shape of a character such as L, D, etc., a special symbol, and so on. The hole having this shape is located at a layer before or after deflecting and/or in the middle of deflecting, in order to shape the electron beam.

A voltage is applied to each unit electron emitter as the first type and an individual voltage is applied to each extractor of the source lens as the second type, and vice versa. Thereby, the electron beams are adapted to be emitted from the electron emitters.

When applied to the electron emitters, the voltage is applied to the above-described individual unit extractors of the source lenses, thereby making the current of the emitted electron beam of the each unit microcolumn constant. To this end, the electron beam current is checked and fed back at the extractor of the each unit microcolumn, so that the voltage to be applied to each unit extractor can be determined. The electron beam current may be controlled at the extractor as well as an added electrode layer. Otherwise, the electron beam current can be checked and compensated using the same method as in the existing single microcolumn. When a different energy or electron beam current is needed, a relative voltage or a preset voltage based on preset data may be applied to each unit extractor. When applied to the electron emitters as the second type, only the voltage applied to the respective unit electron emitters, rather than the extractors, has to be controlled. Alternatively, the voltage may be applied to both the electron emitters and the extractors as the second type.

The electron beam passing through the respective unit extractor has a preset intensity. Thus, the same voltage can be applied to each lens layer as the first type in order to precisely control shape, current, and/or energy of the electron beams required by the other lens layers of the source lens. Of course, a different voltage may be applied to each lens layer, and each lens layer may be controlled as the second type. However, it will be easy to control each lens layer as the first type. Therefore, when the respective unit lens layers of the source lens are controlled as the first type, the electron beams of the respective unit microcolumns have the same shape due to application of the same voltage.

The electron beam passing through the source lens is deflected by the deflector. To be controlled as the third or fourth type, the unit deflector has two or more electrodes and an individual voltage is applied to each electrode. Thereby, deflection of the electron beam can be controlled with precision. In this way, each deflection is controlled in the same method as in a single deflector. Further, as described above, the deflection may be performed by applying the same voltage at each unit coordinate as the third type. For the purpose of precise deflection in the same direction on the whole, two unit deflectors may be used in each unit microcolumn. In this case, the first deflector applies a different voltage at a unit coordinate of each unit deflector as the fourth type, thus precisely controlling a direction of each unit electron beam. Then, the second deflector applies the same voltage at each unit coordinate as the third type, thus deflecting the electron beam passing through the first deflector in the same direction on the whole, and vice versa.

The electron beam passing through the deflector is focused by the focus lens, and controlled as a final electron beam. Here, the same voltage is applied to constituents of each focus lens of the unit microcolumn as the first type, and a different voltage is applied to each lens layer of the focus lens. The focus lens generally uses two or three lens layers as needed, and the one voltage is applied to each of the lens layers respectively. Thus, the electron beam having the same shape is focused on a target object.

Although an exemplary embodiment capable of using the fourth type of FIG. 5 has complicated wiring, the voltage can be applied as in any of the first, second, and third types of FIGS. 2, 3, and 4. Further, in the exemplary embodiment capable of using the third type, the voltage can be applied as in the first or second type. In the exemplary embodiment capable of using the second type, the voltage can be applied as the first type. Therefore, if the control method of each constituent must be changed, both of the exemplary embodiments are wired to have a construction of the fourth type or another modified type. Any one of the above-described types may be selected and used as required.

The foregoing electron beam control method has been described based on the wafer type. However, the control method is the same in the case of combining the general single microcolumns (FIG. 1) to form the multi-microcolumn. In other words, when the wiring as in the attached drawings is performed to control the method of applying voltage to each lens or deflector, the method of the present invention can be sufficiently used. In other words, the same voltage is applied to each electron emitter and a different voltage is applied to each extractor. Further, the deflector is wired like the third or fourth type shown in the attached drawings to apply voltage and the focus lens is wired like the first or second type to apply voltage.

A method of emitting electron beams to scan a sample in a multi-microcolumn will be described below.

Referring to FIG. 6, a single voltage is applied to electron emitters 61 like the first type to generate a potential difference between each electron emitter 61 and each extractor 62, and the individual voltage is applied to the extractors 62 like the second type. Thereby, each of the electron emitters 61 emits electrons. However, each electron emitter may have a different shape and its own characteristic. Thus, in order to make an electron beam current of each unit microcolumn uniform, a compensation voltage is applied to the extractors 62 of a source lens. (The reverse is also possible, and the compensation voltage may be differentiated according to each constituent part of the unit microcolumn.)

In order to control acceleration, shape and/or throughput of the emitted electron beam, the same voltage is applied throughout one or more other layer 63 of the source lens like the first type. For the purpose of more precise control, one or more layer may be added. If necessary, the voltage may be applied like the first or second type.

In order to precisely control a scanning path of the electron beam, two deflectors 64 and 65 are allocated to each unit microcolumn. However, a desired number of deflectors, for example one or more deflectors, may be used. The first deflector 64 is precisely controlled like the fourth type, and the second deflector 65 is controlled like the third type so that the electron beam of each unit microcolumn can perform scanning in the same direction. Further, the second deflector 65 may be used to widen a scanning angle. In this case, the second deflector 65 can be controlled like the third or fourth type.

A focus lens (e.g. an Einzel lens) uses one or more lens layer. A required voltage is applied to each lens layer like the first type, and thereby the focus lens focuses the electron beam. In the present exemplary embodiment, the first, second, and third lens layers 66, 67, and 68 are used for more precise focusing. In order to focus the electron beam, it is preferable that the same voltage is not applied to neighboring lens layers.

Any one of the electron emitter 61 and the extractor 62, the layer 63 of the source lens, the first lens layer 66, and the third lens layer 68 may be grounded and used without separate application of voltage.

A structure combining the deflector and the focus lens is composed of three lens layers. Among the three lens layers, the first and third lens layers are controlled as in the first or second type, and the second lens layer is controlled as in the third or fourth type. The second lens layer may be one or more in number.

The multi-microcolumn for performing the method for controlling the electron beam according to the present invention is formed by arranging wafer-type columns and/or existing microcolumns in an n×m array.

Hereinafter, examples of such a multi-microcolumn will be described. First, as the most basic example, a wafer type multi-microcolumn will be described.

In a single microcolumn, an electron lens is typically formed of a membrane around an aperture and a deflector is frequently formed using a general electrode or wire thicker than the membrane. Here, the membrane has a thickness from several micrometers to tens of hundreds micrometers. As the wafer type multi-microcolumn, electron lens layers are used like the membrane and constitute a wafer. A source lens or a focus lens can perform its function by means of combination of the lens layers. A deflector is made thicker and does not need to be formed in the vicinity of an aperture in a membrane type. Thus, the electron lens and the deflector are both controlled by a combination of four types of control methods described below. First, the wafer-type microcolumn will be described with reference to the attached drawings. In the drawings, one wafer layer includes four unit microcolumns, each of which is allocated to one hole. In order to control the electron beam, four electrodes (90 degrees) are formed at each hole. The number of microcolumns included in the wafer layer and the number of electrodes allocated for the control operation are adjusted as required. In the present exemplary embodiment, the number is simply set to four for ease in understanding the present invention. The following four types of lens layers may be each considered as one module.

As a first type for applying a single voltage to all apertures or electron emitters of the unit microcolumn part (see FIG. 2), one entire layer 20 is formed of one material so that the same voltage is applied to the entire layer 20 regardless of the unit constituent (aperture 21), and the entire layer 20 is provided with one connection 22 so that the entire layer 20 is supplied with a voltage from the outside. In other words, when the voltage is applied to the connection, the entire layer is formed of the same material so that the same voltage is applied to the entire layer. As the material, a conductor or semiconductor capable of applying the voltage to generate the same electric potential is used.

As a second type for applying the individual voltage to the individual aperture or electron emitter of the unit microcolumn part (see FIG. 3), only one electrode 32 is provided to each unit aperture 31 of the layer 30, and voltages are individually applied to the respective unit apertures. In order to connect each electrode with the outside, a number of connections 33, preferably patterns, equal to the number of apertures, that is, the number of unit microcolumns, are formed. In other words, one wafer layer is adapted to include one electrode for each aperture so that control voltages can be individually applied corresponding to the number of unit microcolumns like the extractor. A main material of the second type is similar to that of the first type, and it is necessary to insulate between the apertures. In the drawings, the unit insulation part which has a circular preferably encloses the aperture 31 and it may have some other shape, for example, a polygonal shape.

As a third type for applying the same voltage to the individual same-directional (coordinate) electrodes for the apertures or electron emitters of the unit microcolumn part (FIG. 4), the electrodes 42 are provided to each unit aperture 41 of the layer 40 at corresponding coordinates, and the same voltage is applied to the electrodes at each coordinate. Thus, each corresponding electrode is connected with the outside by one connection 43, preferably one pattern, so that individual control voltages can be applied corresponding to the number of controlled coordinates regardless of the number of unit microcolumns. As the third type of FIG. 4, each aperture of one layer includes four electrodes at an angle of 90 degrees. Specifically, the four electrodes are located in the 12 o'clock, 3 o'clock, 6 o'clock and 9 o'clock directions at each coordinate. Accordingly, the third type can equally apply four different voltages at the coordinates of each aperture.

As a fourth type for applying the individual voltage to the individual apertures (or electron emitters) and the individual electrodes (directions or coordinates) of the unit microcolumn part (FIG. 5), the electrodes 52 are provided to each unit aperture 51 of the layer 50 at the individual coordinates, and the voltage is applied to the electrodes of each aperture respectively. Thereby, the electron beam is individually controlled in each unit microcolumn. Thus, the number of individually applied control voltages and the number of connections 53 provided must be equal to the product of the number of unit microcolumns and the number of controlled coordinates. The fourth type can apply different voltages to four electrodes of each aperture. Therefore, in the present exemplary embodiment, a total of sixteen different voltages can be applied. In this case, the same voltage can be applied at each coordinate as the third type, or an individual voltage can be applied to each electrode of the unit aperture regardless of the coordinate.

The first type is used for converging or diverging (spreading) the electron beam or controlling a potential difference between the electron emitter and the extractor. The second type is used for compensating for a potential difference between the electron emitter and the extractor first and for an overall current of the electron beams. That is, the electron emitter and the extractor are used in a combination of the first and the second types. Alternatively, the electron emitter and the extractor may be used only as the second type. The third type is used for collectively displacing the electron beams in a specified direction in the multi-microcolumn at the same time. The fourth type is mainly used for individually controlling the electron beam in each unit microcolumn. In particular, the fourth type may have many modifications. According to one modification, when the same voltage must be applied to electrodes at the same coordinate of all apertures or the individual voltage must be applied to unit aperture individually, the entire vicinity between the designated apertures is used as an electrode and a space between the apertures is insulated with an insulating material. In this manner, the fourth type may be replaced in the case of a specific use. In this case, when the same electrode is provided to each branched aperture, the different voltages corresponding to the number of apertures have only to be changed, so that the number of cases related to control operation can be reduced. Therefore, the fourth type is more difficult to fabricate but easy to modify due to a large number of cases related to control operation. The fourth type may serve as the first, second, or third type. The third type may serve as the first or second type. And, the second type may serve as the first type. Therefore, when it is necessary either to modify each constituent variously or to change the control method of each constituent unit, the multi-microcolumn can be used by providing the construction of the fourth type or a construction of a more variously modifiable type, performing wiring, and varying the control method as required.

While the present invention has been described with reference to the case of four electrodes for controlling the electron beams passing through each aperture in the unit microcolumn of the third or fourth type, on the basis of the multi-microcolumn consisting of four unit microcolumns, the number or array of unit microcolumns may be varied as required. It does not matter whether one or more directional electrodes are used for each aperture. However, four to eight electrodes are generally used. Although one or more electrode is used, the type of voltage application to the electrode to control the electron beam can be performed in the same or a similar manner.

The construction of the wafer type multi-microcolumn according to the present invention can be controlled by combining layers of each of the above-described types.

Now, referring to FIG. 7, an electron emitter 70 may be formed in the first or second type, but it is composed of one wafer layer so that the same voltage is applied like the first type. Although the same voltage is applied, the emitted electron beams may be varied depending on a tip 71 of each electron emitter. This is because the same quantity of electrons is not actually emitted due to various reasons such as difference in the shape of the tip. Each electron emitter may be an existing electron emitter such as a tungsten (W) emitter, a schottky emitter, a silicon (Si) emitter, a molybdenum emitter, a CNT (nano-carbon tube) emitter, and so on, which are generally used. The respective emitters are all adapted to be connected to have the same voltage.

Accordingly, in order to make the electron beam current emitted from the electron emitter uniform, a voltage of each extractor of a first electron lens (source lens) must be applied according to each emitter. For this reason, the extractor layer is used as the second type. As for the extractor, each aperture requires a individual voltage but not orientation. Thus, it is preferable for each unit aperture to have one circular electrode that encloses the overall apertures constituting the unit microcolumn. Here, usage of the electron beam emitted from each electron emitter can be checked through an electron beam current passing through the column, so that a required voltage can be differentially applied to each electron emitter. Thereby, the electron beam current emitted from the electron emitters can be made uniform. As one example, the source lens has an extractor layer as the second type and the other layers as the first type similar to the electron emitter. In other words, the other layers are for controlling the shape of the electron beam. It is preferable that the other layers are used as the third type in a special case and are otherwise used as the first type. The number of layers of the source lens excluding the extractor is determined in consideration of controlling the shape of the electron beam and can be one or more depending on the degree of control precision required. Alternatively, the relationship between the electron emitter 70 and the extractor may be reversed. Specifically, the electron emitter 70 may be used as the second type, and the extractor is used as the first type. In this case, the same result can also be obtained.

The deflector requires one or more electrode and may be used in the third or fourth type in the multi-microcolumn. If all the electron beams simultaneously scan the same coordinate, the deflector may be used as the third type. In order for the electron beams to scan the same coordinate in the multi-microcolumn, the first deflector precisely controls the electron beams as the fourth type, and then the same voltage is applied as the third type at each coordinate. Thereby, the electron beams can scan a designated coordinate or direction. Here, the reverse is also possible and may be better depending on the circumstances. When the respective electron beams are individually controlled as required, all layers may be used as only the fourth type. Further, the electron beams can be more precisely controlled using the third and fourth types for the electron emitters and the extractors. Therefore, the above-described types based on each constituent in the multi-microcolumn according to the present invention can be variously selected. As the simplest example where deflection is least required, all the constituents may be formed as the first type.

An additional deflector may be used to widen the angle and scan range of each electron beam. In other words, two or more electrodes are symmetrically arranged to widen the scan range, and thus the deflector may be added as required. The number of additional deflectors can be determined according to the required scan range, etc.

Each focus lens (a second lens) is for controlling a shape of the electron beam scanned onto a sample. To this end, while the focus lens comprises one or more layers as required, three layers are generally used. The layers are all used as the first type and different voltages are applied thereto. Further, the same voltage is applied to each aperture of one layer. Thus, the electron beam scanned onto the sample is focused by the focus lens. A voltage applied to a second electron lens for focusing is related to electron energy. Thus, when each unit microcolumn from the electron emitter 70 has the same energy, the layers of the first type are preferably used for a second electron lens. In contrast, if each unit microcolumn has different energies, the layer of the second type is preferably used. Further, all the layers are used as the second type enabling compensation of the energy of the beam. In order words, when the electron emitter is used as the second type, and when variation of the beam energy reaching the sample is required due to a difference in column structure (single microcolumn), the voltage applied to the entire focus lens can be controlled.

Just because the same type is used in each lens or deflector, the voltage applied is not necessarily the same, and so different voltages can be applied as required. Here, when the same voltage is applied, it is possible to use one power source. Each wafer-type layer is insulated by an insulating layer (not shown) which can be fabricated by using a general method of fabricating a semiconductor wafer or an MEMS (Micro-Electro-Mechanical Systems) process.

To be more specific, as shown in FIG. 7, the electron emitter layer 70 is fabricated by forming (or bonding) an n×m number of emitter tips corresponding to the number of unit microcolumns on a layer of the electron emitter whose existing tips and whole layer are formed of the same material, or the whole of which is formed of a silicon material. When a voltage is applied to the electron emitters, electrons are emitted from the tips of the electron emitters. Further, only tips are formed in the center of each electron emitter layer, portions other than tips are insulated, and the same voltage is applied to each tip.

The wafer-type multi-microcolumn may be formed layer by layer, which is different from a way in which each lens or deflector of the single microcolumn is discriminated. However, a standard of the aperture of each layer or electrode can be determined according to each type shown in the attached drawings. The number of apertures equal to the number of unit microcolumns is required. Thus, the layer is formed according to each type and by determining which type is applied to each layer. Each type is fabricated by forming one or more connections to which a voltage can be applied from the outside, and forming the electrode for each aperture, or forming the entire structure with a material to which a voltage can be applied. When the electrodes are formed, all but the electrodes alone make use of an insulating material on the focus of the aperture. Wiring of each electrode can be performed taking the attached drawing as example. A space must be left between the respective layers like the single microcolumn. Here, each space is formed of an insulating layer. The insulating layer is formed with an aperture or hole of appropriate size so as not to be an obstacle in the path of the electron beam. Further, FIG. 9 is a plan view showing an example of another control layer of a second type according to the present invention. This example involves forming an electrode serving as a unit lens in each unit microcolumn through, for example, etching a lens layer like a first type. A unit lens 92 including a lens hole 91 is etched and insulated together with other neighboring unit lenses so that a voltage is separately applied to a region of each unit microcolumn. In order to apply the voltage to each unit lens, wiring can be performed through a separate etched portion (when there are many unit microcolumns). In this case, the unit lenses 92 may be formed by a process other than etching, but are most preferably formed by etching. This is because bonding and etching a general lens layer on an upper or lower insulating layer is more rapid and precise than combining individual pieces by means of, for example, bonding.

FIG. 10 is a plan view showing an example of yet another control layer of third and/or fourth types mainly forming a deflector layer in accordance with the present invention, which is for forming each electrode by subdividing and etching the layer of FIG. 9 rather than separately forming a coordinate of the electrode. That is, a fabricating method can be the same as used to form the layer of FIG. 9. Therefore, as shown in FIG. 10, each unit lens or deflector subdivides and etches unit electrodes 92a, 92b, 92c, and 92d on the focus of a unit aperture 91a to insulate between the unit electrodes. In the example shown in FIG. 10, the third and fourth types are discriminated only by a difference in wiring. The wiring is possible by using each etched portion like FIG. 9, and a wiring method can be performed by using, for example, a pattern outside or within the etched portion similar to as shown in FIG. 4 or 5.

The method for controlling the electron beams in the multi-microcolumn according to the present invention can be made identical by arranging general single microcolumns in an n×m array, besides the wafer-type multi-microcolumn. Further, an intermediate type between the general type and the wafer type can form the multi-microcolumn according to the present invention. For example, as shown in FIG. 8, a hybrid-type multi-microcolumn 80 includes an electron emitter layer having electron emitter tips 82 and a fixture 81 for fixing the tip 82 to a unit microcolumn; a source lens having an extractor layer 83, an insulating layer 84, and the other lens layer 85; a deflector 86; and a focus lens having a first lens layer 87, a second layer 88, and a third layer 89. The four constituents are each provided on each layer of the wafer type and can be fixed to a housing 90 like the existing single microcolumn. In this case, the electron emitter layer may use the electron emitter layer 70 of FIG. 7. In the case of this hybrid type, a constituent unit of each portion, rather than a wafer type of layer, in the housing 90 of the whole multi-microcolumn is inserted and fixed using a fixing means such as the fixture so as to correspond to the unit microcolumn, as used as a complex of the single microcolumn, for example, by fixing the electron emitter tip 82 to the fixture 81. In addition, since it is possible to fabricate the source or focus lens as the wafer type in advance by multiplexing a membrane of the conventional single microcolumn, the whole multi-microcolumn can be fabricated by employing the housing 90 as shown in FIG. 1, setting up positions of the electron emitter, source lens, deflector, and focus lens in advance, and forming the source and focus lenses as the wafer type in advance. Further, the hybrid-type multi-microcolumn may be fabricated by forming only the electron emitter and source lens as the wafer type and the others in the forms of a general single microcolumn, and using a means similar to the fixture for the electron emitter in the housing 90. In other words, in the case of the hybrid type, the multi-microcolumn can be fabricated in various ways.

A beam blanker layer may be added to the multi-microcolumn between arbitrary layers as described above with reference to the control method, but it is preferably located in front of the deflector. And, while its structure may be used as the third or fourth type, it is preferably used as the third type having two electrodes. Depending on the circumstances, the fourth type may be more efficient. Further, in order to form the electron beam in a predetermined shape, the lens layer may be added before, after, or in the middle of deflecting, as the first type. In this case, the shape of the electron beam can be controlled only by grounding of the first type. The beam blanker layer and the lens layer for forming the predetermined shape are used by determining a position and a number as required. Consequently, a structure of each layer in the multi-microcolumn can be made as any one of the first, second, third, and fourth types, or as a combination thereof.

Mode for the Invention

Hereinafter, various exemplary embodiments of the present invention will be described with reference to FIGS. 11 to 13.

FIGS. 11 and 12 show exemplary embodiments of operation of a microcolumn. FIG. 11 shows an exemplary embodiment with the above-described focus lens and FIG. 12 shows an exemplary embodiment without a separate focus lens.

In FIG. 11A, an electron beam B emitted from an electron emitter 100 passes through holes of a source lens 130. Then, the electron beam B is deflected by a deflector 140 and focused on a sample by a focus lens 160. This exemplary embodiment has one deflector unlike the above-described example and is very similar to the above-described operation or multi-microcolumn.

FIG. 11B shows an exemplary embodiment of removing a separate deflector so as to perform both focusing and deflecting using a deflector type lens layer. This technology is disclosed in papers "Lens and Deflector Design for Microcolumn", Journal of Vacuum & Science Technology, B13(6), pp. 2445-2449, 1995, and "The Electrostatic Moving Objective Lens and Optimized Deflection Systems for Microcolumn" Journal of Vacuum & Science Technology, B13(6), pp. 3802-3807, 1995. As for a microcolumn of FIG. 11B, a deflector type lens layer of the third or fourth type is inserted in the middle layer of a focus lens 161 in order to operate as the third or fourth type without the deflector 140 of FIG. 11A, thereby performing focusing and deflecting.

In FIG. 12A, an electron beam B' emitted from an electron emitter 100 passes through holes of a source lens 130. The source lens 130 is composed of an upper lens layer 130a, a middle lens layer 130b, and a lower lens layer 130c. Here, the upper lens layer 130a serves as an extractor stimulating electron emission from the electron emitter 100. The middle lens layer 130b serves as an accelerator for accelerating electrons emitted from the electron emitter 100 and performing focusing. The lower lens layer 130c improves focus of the electron beam B' on a sample and restricts an efficient electron beam. This focused electron beam is deflected to the sample by the deflector 140.

In FIG. 12B, an electron beam B' emitted from an electron emitter 100 passes through holes of a source lens 130 and is deflected to and focused on a sample. The source lens 130 of FIG. 12B is composed of an upper lens layer 130a, a middle lens layer 130b' and a lower lens layer 130c. The microcolumn of FIG. 12B is characterized in that a lens is structurally similar to the source lens, and particularly, the middle lens layer 130b' performs a deflecting function at the same time, and only three lens layers form a simple microcolumn. In other words, use of the lens layer serving as the deflector at the same time allows the microcolumn with the lens to have a simple structure. Further, in the configuration of FIG. 12B, all of the three lens layers may be used as the lens layer for serving as the deflector at the same time, but the lens layer for performing deflection is more complicated in wiring or control of the lens than the general lens. Thus, it is preferably that only a required number of such lens layers are used. In the microcolumn having the configuration of FIG. 12B, the upper lens layer 130a serves as the extractor to stimulate electron emission from the electron emitter 100. The middle lens layer 130b' performs the accelerator function that accelerates electrons emitted from the electron emitter 100 and the focusing and deflecting functions at the same time. The lower lens layer 130c performs the focusing function and serves to improve focus of the electron beam B' on the sample and restrict the efficient electron beam.

The microcolumn according to the present invention as shown in FIG. 12 is designed to make a voltage difference between the lens layers of the source lens to simultaneously focus the electron beam passing through the source lens.

The operation of performing the above-described deflecting function can use the above-described third or fourth type, and the lens can use the third or fourth type. While one unit microcolumn is shown in the drawings for the sake of convenience, the multi-microcolumn is equally operated and/or configured by multiplexing the unit microcolumn in the n×m array as set forth above.

The operation and configuration of the multi-microcolumns of FIGS. 11 and 12 are similar to those of the above-described microcolumn. In other words, the electron emitter 100 and the extractor of the source lens are equally controlled in the first and second types in a correlated complementary manner and construct the multi-microcolumn by means of the configuration of the first and second types. And, the deflector 140, or the lens serving as the deflector is constructed using the lens layer of the third or fourth type, and the method of controlling the deflector is the third or fourth type. The other general lens layers are controlled as the first type manner using the lens layer of the first type, or as the second type manner using the lens layer of the second type, as required. The deflecting function and the function of the focusing lens, or the specified lens layer (extractor, accelerator etc.) of the other source lens, can use the principle described above with no change.

In the multi-microcolumn of FIGS. 11B and 12B, each lens layer may be adapted to perform the deflecting function together, but the number of deflectors is preferably as many as the number of necessary layers. The deflecting function is performed when a potential difference between the direction-specific electrodes of the corresponding lens layers is maintained. Further, the focusing, as set forth above, is performed by accumulating potential for each electrode to the corresponding layer of each deflector to apply the accumulated potential, because the same voltage is generally applied to each layer. In other words, a different potential difference is applied to the electrode of each layer for each deflection, and a voltage for focusing or another function is equally added and applied. Then, the electrode-specific potential differences are maintained as required for deflecting, and the voltage required for focusing or another function is applied to all electrodes. Of course, when a separate voltage is not applied in the grounded state as set forth above, only the voltage required for the deflecting is applied with no change. In this case, a control method can be rather simplified by combining the deflecting and another function (e.g. focusing).

FIG. 13 schematically shows a configuration of the multi-microcolumn based on the operation of FIGS. 11 and 12.

FIG. 13A is an exploded perspective view of an exemplary embodiment of a multi-microcolumn according to the present invention, in which the multi-microcolumn 170 is formed using an electron lens. The multi-microcolumn of FIG. 13A includes a multi-electron emitter 171, a source lens 173, and a deflector 176 composed of two deflector type lenses 176b of the third or fourth type. Namely, the exemplary embodiment shown in FIG. 12A is configured as the multi-microcolumn. A layer between the deflector type lenses 176b serves as an insulating layer for ensuring insulation and separation of the deflectors.

Further, FIG. 13B is an exploded perspective view of another exemplary embodiment of multi-electron column according to the present invention having the configuration of a simple multi-electron column having a mode similar to that of FIG. 12B as described above. Here, the multi-electron columns composed of lens layers among which a middle layer 173b of the source lens 173 performs a deflecting function of the third or fourth type at the same time without a separate deflector.

In FIG. 13B, the source lens and the deflector are formed by combining the lens layers. Although a configuration between lens layers is not described in detail, an insulating layer may be interposed between them, and the lenses may be connected by a conventional method.

The source lens shown in FIGS. 12 and 13 simultaneously performs a function of the existing source lens and a focusing function. The source lens of the present invention is different from the conventional source lens. The exemplary embodiments of FIGS. 12 and 13 can be applied, as the multi-microcolumn, to all types of apparatuses for emitting electron beams using electron emitters. In other words, the present invention can be applied to an electron microscope, an electron beam analyzer, electron beam lithography equipment, as well as a Scanning Field Emission Display (SFED) which is thin and has a large display area.

In addition, in order to temporally interrupt or deflect the electron beam emitted from the multi-microcolumn, a beam blanker lens layer may be added between the lens layers of the multi-microcolumn, and preferably before deflecting. Here, the third or fourth type may be used. In other words, because it does not matter that all the electrons are absorbed or deflected at the lens layer by deviation from a coordinate at which the electron beam is emitted, no more than a voltage required to generate an electron beam current need be applied. In this case, like the deflector, many electrodes are not needed and two electrodes are generally sufficient. When an opposite voltage is applied or a voltage is applied to one electrode, the electrode beam is interrupted or deflected. Therefore, two electrodes and the third type are preferably used (generally, with one side grounded).

Industrial Applicability

Since the above-described multi-microcolumn is small and lightweight, it can be used in conventional XYZ robots, arm robots, and the like. When applied to a multi-joint robot, etc., in industrial or measurement equipment in which it can be easily attached, the multi-microcolumn can be used in various ways. For example, the multi-microcolumn can be applied in the field of lithography or measurement, where the microcolumn has conventionally been applied, to achieve a greater range of effects. In this case, an attaching method may be a conventional method such as using the multi-microcolumn in an industrial robot and the like without modification. In general, the electron beam apparatus has the multi-microcolumn fixed to a sample at a predetermined angle and the sample moves up, down, left, and right, or is inclined at a predetermined angle. Alternatively, the multi-microcolumn itself may measure the sample when being titled and displaced up, down, left, and right in real time. This method is very efficient for measurement of a large-area sample. Further, since the microcolumn can move by itself or together with the sample, it is possible to shorten a measurement time and enhance measurement efficiency.

Further, the multi-microcolumn control method or a modified multi-microcolumn can be used for a thin, large-area display (thin film type) such as an SFED.

The invention claimed is:
1. A method for controlling electron beams in a multi-microcolumn, in which unit microcolumns comprising an emitter and one or more electron lenses which include two or more lens layers and one or more deflectors for emitting electrons to form and control the electron beams are arranged in an n×m matrix, the method comprising the steps of:

applying a voltage to the individual electron emitters according to a first or second type and applying a voltage to individual extractors of the lens according to the first or second type in order to induce emission and electron current, without applying voltages to both the electron emitters and the extractors according to the first type simultaneously;

applying a voltage to an electron lens which includes two or more lens layers according to the first type and the second type; and applying a voltage according to a third type to deflect the electron beams after applying a voltage to a lens layer according to the first type, wherein the first type applies a single voltage to all apertures through which the electrons of the unit microcolumns pass or to all the electron emitters, the second type applies individual voltages to individual apertures or electron emitters of each unit microcolumn, and the third type applies the same voltage to each same-directional electrode per unit microcolumn.

2. The method according to claim 1, further comprising a step of applying a voltage according to a fourth type to deflect the electron beam, wherein the fourth type applies individual voltages to individual electrodes of each unit microcolumn.

3. The method according to claim 1, further comprising a step of focusing each electron beam, wherein the steps of deflecting and focusing are performed at the same time.

4. The method according to claim 1, wherein the voltage is applied to a lens layer having a predetermined shape according to the first type in the step of deflecting, before the step of deflecting, or after the step of deflecting, in order to form each electron beam in a predetermined shape.

5. The method according to claim 1, wherein a beam blanker layer is controlled according to the third or fourth type in order to interrupt each electron beam.

6. A multi-microcolumn having unit microcolumns comprising an emitter and one or more electron lenses which include two or more lens layers and one or more deflectors for emitting electrons to form and control an electron beam in an n×m matrix, the multi-microcolumn comprising:

individual electron emitters constructed on a layer in which all the emitters are electrically connected or all the emitters are not electrically connected;

individual electron lenses selectively constructed with lens layers selected from among:

a first type lens layer in which all apertures through which the electrons of the unit microcolumns pass are electrically connected, a second type lens layer in which all apertures through which the electrons of the unit microcolumns pass are not electrically connected, a third type lens layer in which all same-directional (-coordinate) electrode per unit microcolumn is electrically connected, and a fourth type lens layer in which all same-directional (-coordinate) electrode per unit microcolumn is not electrically connected;

an extractor layer which is a first type lens layer or a second type lens layer, a first type lens layer being not used when all the emitters are electrically connected;

an electron lens including one or more first type lens layers and one or more second type lens layers; and a deflector or a lens layer which is a third type lens layer to serve as a deflector, being arranged after a first type lens layer.

7. The multi-microcolumn according to claim 6, further comprising a deflector or a lens layer as a fourth type lens layer to serve as a deflector.

8. The multi-microcolumn according to claim 6, wherein the electron emitters and the lenses have layers formed as a wafer type by a semiconductor fabrication or an MEMS (Micro-Electro-Mechanical Systems) process and insulated by an insulating layer.

9. The multi-microcolumn according to claim 6, wherein the multi-microcolumn is attached to and used together with an industrial robot including an XYZ robot or arm robot, or a multi-joint transfer mechanism.

10. The multi-microcolumn according to claim 6, wherein an aperature of one layer of each lens of the multi-microcolumn has a predetermined shape in order to form each electron beam in the predetermined shape.

11. The multi-microcolumn according to claim 6, further comprising a beam blanker layer of the third or fourth type in front of a deflector or the lens serving as the deflector in order to interrupt or deflect the electron beam of the multi-microcolumn.

12. The method according to claim 2, further comprising a step of focusing each electron beam, wherein the steps of deflecting and focusing are performed at the same time.

13. The method according to claim 2, wherein the voltage is applied to a lens layer having a predetermined shape according to the first type in the step of deflecting, before the step of deflecting, or after the step of deflecting, in order to form each electron beam in a predetermined shape.

14. The method according to claim 2, wherein a beam blanker layer is controlled according to the third or fourth type in order to interrupt each electron beam.

15. The method according to claim 3, wherein a beam blanker layer is controlled according to the third or fourth type in order to interrupt each electron beam.

16. The multi-microcolumn according to claim 7, wherein the electron emitters and the lenses have layers formed as a wafer type by a semiconductor fabrication or an MEMS (Micro-Electro-Mechanical Systems) process and insulated by an insulating layer.

17. The multi-microcolumn according to claim 7, wherein the multi-microcolumn is attached to and used together with an industrial robot including an XYZ robot or arm robot, or a multi-joint transfer mechanism.

18. The multi-microcolumn according to claim 7, wherein an aperature of one layer of each lens of the multi-microcolumn has a predetermined shape in order to form each electron beam in the predetermined shape.

19. The multi-microcolumn according to claim 7, further comprising a beam blanker layer of the third or fourth type in front of a deflector or the lens serving as the deflector in order to interrupt or deflect the electron beam of the multi-microcolumn.

20. The multi-microcolumn according to claim 8, further comprising a beam blanker layer of the third or fourth type in front of a deflector or the lens serving as the deflector in order to interrupt or deflect the electron beam of the multi-microcolumn.

* * * * *